United States Patent [19]

Schnable et al.

[11] Patent Number: 4,751,554
[45] Date of Patent: Jun. 14, 1988

[54] SILICON-ON-SAPPHIRE INTEGRATED CIRCUIT AND METHOD OF MAKING THE SAME

[75] Inventors: George L. Schnable, Lansdale, Pa.; Kenneth M. Schlesier, Stockton, N.J.

[73] Assignee: RCA Corporation, Princeton, N.J.

[21] Appl. No.: 780,897

[22] Filed: Sep. 27, 1985

[51] Int. Cl.[4] .......................... H01L 27/12
[52] U.S. Cl. .......................... 357/4; 357/41; 357/59
[58] Field of Search .................. 357/4, 41, 59

[56] References Cited

U.S. PATENT DOCUMENTS

| | | | |
|---|---|---|---|
| 3,511,702 | 5/1970 | Jackson, Jr. et al. | 117/212 |
| 3,740,280 | 6/1973 | Ronen | 156/11 |
| 3,890,632 | 6/1975 | Ham et al. | 357/23 |
| 3,943,542 | 3/1976 | Ho et al. | 357/23 |
| 3,974,515 | 8/1976 | Ipri et al. | 357/23 |
| 4,002,501 | 1/1977 | Tamura | 148/1.5 |
| 4,016,016 | 4/1977 | Ipri | 148/175 |
| 4,076,573 | 2/1978 | Shaw et al. | 156/613 |
| 4,160,260 | 7/1979 | Weitzel | 357/4 X |
| 4,174,217 | 11/1979 | Flatley | 96/36.2 |
| 4,178,191 | 12/1979 | Flatley | 148/1.5 |
| 4,183,134 | 1/1980 | Oehler et al. | 29/571 |
| 4,199,384 | 4/1980 | Hsu | 148/174 |
| 4,199,773 | 4/1980 | Goodman et al. | 357/23 |
| 4,242,156 | 12/1980 | Peel | 357/4 X |
| 4,252,582 | 2/1981 | Anantha et al. | 148/175 |
| 4,263,709 | 4/1981 | Weitzel et al. | 29/571 |
| 4,277,884 | 7/1981 | Hsu | 29/571 |
| 4,313,809 | 2/1982 | Benyon | 204/192 |
| 4,323,910 | 4/1982 | Sokoloski et al. | 357/23 |
| 4,341,569 | 7/1982 | Yaron et al. | 148/1.5 |
| 4,356,623 | 11/1982 | Hunter | 29/571 |
| 4,368,085 | 1/1983 | Peel | 148/33.3 |
| 4,385,937 | 5/1983 | Ohmura | 148/1.5 |
| 4,393,572 | 7/1983 | Policastro et al. | 29/571 |
| 4,393,578 | 7/1983 | Cady et al. | 29/576 |
| 4,395,726 | 7/1983 | Maeguchi | 357/41 |
| 4,447,823 | 5/1984 | Maeguchi et al. | 357/23 |
| 4,455,738 | 6/1984 | Houston et al. | 29/571 |
| 4,472,459 | 9/1984 | Fisher | 427/93 |
| 4,491,856 | 1/1985 | Egawa | 357/41 X |
| 4,523,963 | 6/1985 | Ohta et al. | 148/1.5 |
| 4,533,934 | 8/1985 | Smith | 357/23.7 |
| 4,547,231 | 10/1985 | Hine | 148/175 |
| 4,557,794 | 12/1985 | McGinn et al. | 156/612 |
| 4,604,304 | 8/1986 | Faraone et al. | 427/255 |
| 4,658,495 | 4/1987 | Flatley et al. | 29/571 |

FOREIGN PATENT DOCUMENTS 133667  8/1982  Japan .

OTHER PUBLICATIONS

Ansell et al., "CMOS in Radiation Environments," *VLSI Systems*, Sep. 1986, pp. 28–36.
Hughes et al., "Oxide Thickness Dependence of High--Energy-Electron-, VuV-, and Corona-Induced

[57] ABSTRACT

An SOS integrated circuit includes a plurality of spaced islands of single-crystalline silicon on a surface of a sapphire substrate. A conformal layer of silicon oxide is on the surface of the sapphire substrate between the islands and extends along a portion of the side surfaces of the islands. A layer of polycrystalline silicon is over the silicon oxide layer and extends over the side surface and at least a portion of the top surface of the islands. A separate field-effect transistor is on each island and includes source and drain regions spaced by a channel region and a channel dielectric layer over the channel region. The polycrystalline silicon layer may extend over the channel dielectric to serve as the gate of the transistor. The method of making the circuit includes depositing the silicon oxide layer over the sapphire substrate surface and the islands, and applying a layer of a negative photoresist over the silicon oxide layer. Light is directed through the sapphire substrate to expose portions of the photoresist layer which are not over the islands. The unexposed portions of the photoresist layer are removed to expose portions of the silicon oxide layer which are over the islands. These exposed portions of the silicon oxide layer are removed with a suitable etchant.

6 Claims, 2 Drawing Sheets

Charge in MOS Capacitors," *Applied Physics Letters,* vol. 29, No. 6, Sep. 15, 1976, pp. 377–379.

Naruke et al., "Radiation-Induced Interface States of Poly-Si Gate MOS Capacitors Using Low Temperature Gate Oxidation," *IEEE Transactions on Nuclear Science,* vol. NS-30, No. 6, Dec. 1983, pp. 4054–4058.

Saks et al., "Radiation Effects in MOS Capacitors with very Thin Oxides at 80°K.," *IEEE Transactions on Nuclear Science,* vol. NS-31, No. 6, Dec. 1984, pp. 1249–1255.

W. E. Ham, "The Study of Microcircuits by Transmission Electron Microscopy", RCA Review, vol. 38, Sep. 1977, pp. 351–389.

K. Tanno et al., "Selective Silicon Epitaxy Using Reduced Pressure Technique," Japanese Journal of Applied Physics, vol. 21, No. 9, Sep. 1982, pp. L564–L566.

J. S. Chang, "Selective Reactive Ion Etching of Silicon Dioxide," Solid State Technology, Apr. 1984, pp. 214–219.

*Primary Examiner*—Martin H. Edlow
*Attorney, Agent, or Firm*—Henry I. Steckler; Allen LeRoy Limberg

SILICON-ON-SAPPHIRE INTEGRATED CIRCUIT AND METHOD OF MAKING THE SAME

The government has rights in this invention pursuant to Subcontract No. A5ZV-522881-E-507 under Contract No. FO4704-84-C-0061 awarded by the Department of the Air Force.

The present invention relates to a silicon-on-sapphire integrated circuit which includes MOS field-effect transistors, and more particularly, to such a circuit having improved radiation-hardened characteristics.

BACKGROUND OF THE INVENTION

A silicon-on-sapphire (SOS) integrated circuit includes a plurality of spaced, isolated islands of single-crystalline silicon on the surface of a sapphire substrate. Each island generally includes an MOS field-effect transistor which has source and drain regions spaced by a channel region, a channel oxide layer over at least the channel region and a conductive gate on the oxide layer and over the channel region. The various MOS field-effect transistors are electrically connected to form a desired circuit, such as a complementary MOS (CMOS) integrated circuit. The MOS field-effect transistors are generally electrically connected, at least in part, by conductive interconnects of polycrystalline silicon which extend over the surface of the sapphire substrate between the various silicon islands.

When such an SOS integrated circuit is used in an environment where it is subjected to radiation, the radiation creates secondary electrons as it passes through the sapphire substrate. These secondary electrons have a high kinetic energy, greater than 20 electron volts for sapphire, which is rapidly lost through scattering events until they are thermalized to the conduction band. These electrons then drift in an electric field, causing current flow, until they are either trapped, recombined with ionized core atoms, or pass through device contacts. Thus, in an SOS integrated circuit in which polycrystalline silicon conductors are directly on the surface of the sapphire substrate, the photogenerated electrons in the sapphire will flow into the polysilicon conductors which conduct the electrons into the field-effect transistors in the silicon islands. This flow of electrons can adversely affect the operation of the circuit formed in the SOS integrated circuit.

SUMMARY OF THE INVENTION

The present invention relates to an integrated circuit which includes a substrate of sapphire having at least one island of single-crystalline silicon on a major surface of the substrate. A layer of an insulating material is on the substrate surface and extends partially along a side surface of the island. The insulating layer is of a thickness less than the thickness of the island. A layer of conductive polycrystalline silicon is on the insulating layer and extends along the side surface of the island and over the top surface of the island. The integrated circuit is formed by forming at least one island of single crystalline silicon on a surface of a sapphire substrate and applying a conformal layer of an insulating material over the exposed area of the substrate surface and over the surface of the island, the insulating material layer being of thickness less than the thickness of the island. The portions of the insulating layer which are over the top surface of the island and over portions of the side surface of the island are then removed and a layer of conductive polycrystalline silicon is provided over the insulating layer, the side surface of the island and at least a portion of the top surface of the island.

DETAILED DESCRIPTION OF PREFERRED EMBODIMENT

Figure 1:
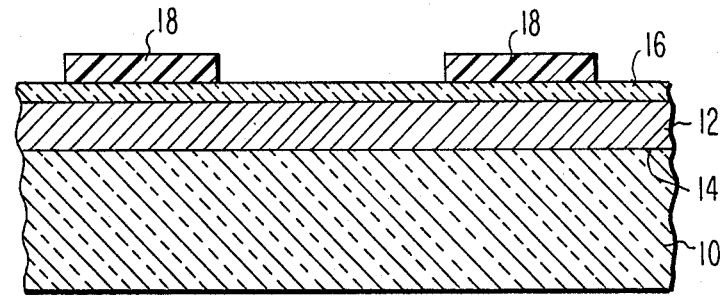
FIGS. 1-6 are sectional views illustrating the various steps in sequence of the method of the present invention for forming a silicon-on-sapphire integrated circuit.

Referring initially to FIG. 1, the SOS integrated circuit of the present invention is made by the method of the present invention starting with a substrate 10 of sapphire having a heteroepitaxial layer 12 of single crystalline silicon on a major surface 14 thereof. The silicon layer 12 is of a thickness of between 0.3 and 0.6 micrometer. A silicon oxide layer 16 is formed on the surface of the silicon layer 12, such as by heating the silicon layer 12 at a temperature of about 1,000° C. in an oxidizing ambient, such as water vapor. A layer of a photoresist is coated on the silicon oxide layer 16, and, using standard photolithographic techniques, is defined to form areas 18 over the areas of the silicon layer 12 which are to form the SOS islands. The exposed portions of the silicon oxide layer 16 are then removed, such as by a buffered hydrofluoric acid etch or by a plasma etch. The exposed areas of the silicon layer 12 are then etched by a reactive ion etching process to form islands 20 of the single crystalline silicon which are spaced apart on the sapphire surface 14. By forming the islands 20 by a reactive ion etching technique, the island 20 will have side edges 22 which are substantially perpendicular to the top surface 24 of the islands 20 and the surface 14 of the sapphire substrate 10. The photoresist areas 18 are then removed with a suitable solvent and the silicon oxide layer 16 which is on the top surface 24 of the islands 20 are removed with a chemical etchant, such as buffered hydrofluoric acid.

Figure 2:
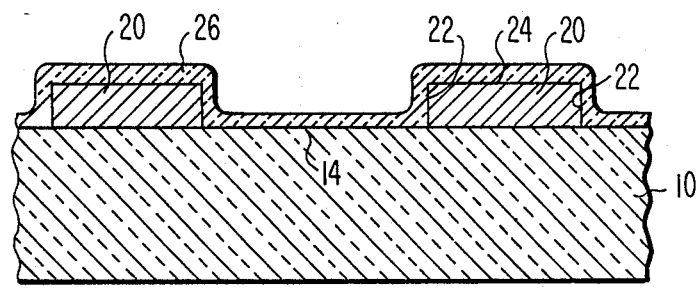

As shown in FIG. 2, a conformal layer 26 of silicon oxide is then formed over the exposed surface area of the substrate surface 14, and the side surfaces 22 and top surfaces 24 of the silicon islands 20. By a conformal layer it is meant a layer having a substantially uniform thickness therethroughout. The conformal layer 26 is of a thickness less than the thickness of the silicon islands 20, preferably of a thickness in the order of 1,000 Angstroms. The conformal layer 26 of silicon oxide may be deposited by a low pressure chemical vapor deposition technique wherein the substrate 10, having the islands 20 thereon, is placed in a chamber and, with the pressure in the chamber reduced, is exposed to an atmosphere of silane and oxygen which is heated to about 400° C. The silane and oxygen react to form silicon oxide which deposits on the substrate surface 14 and the surfaces of the islands 20.

Figure 3:
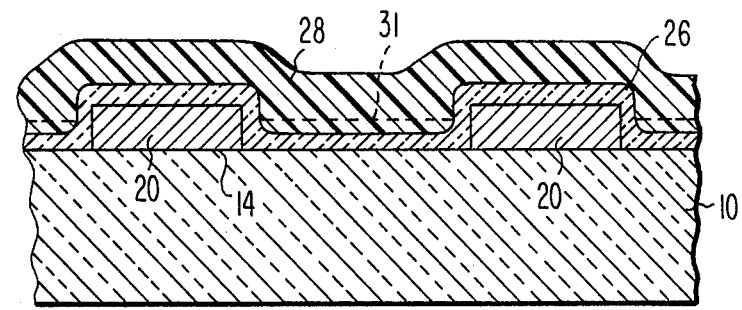
Figure 3:
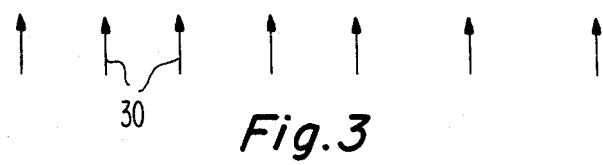

As shown in FIG. 3, a layer 28 of a negative photoresist is then applied over the silicon oxide layer 26. After applying the photoresist layer 28, such as by the well-known spin-on technique, the photoresist is baked to volatilize the solvents in the photoresist. The photoresist layer 28 is then subjected to light of a wavelength to which the photoresist is sensitive by passing the light first through the sapphire substrate 10 as indicated by the arrows 30. This exposes the portion of the resist layer 28 which is on the portion of the silicon oxide layer 26 which is directly on the substrate surface 14 between the silicon islands 20. The silicon islands 20 will mask the portion of the resist layer 28 which is directly over the silicon islands 20 and thereby prevent exposure of such portions of the resist layer. By controlling the time of exposure, polymerization of the resist layer 28 can be limited to that portion of the resist layer 28 which is immediately adjacent the portions of the silicon oxide layer 26 directly on the substrate surface 14 as indicated by the dashed lines 31. For reasons which will be explained, it is preferable that polymerization of the photoresist layer 28 be limited to a thickness which, combined with the thickness of the silicon oxide layer 26, is no greater than the thickness of the silicon islands 20.

Figure 4:
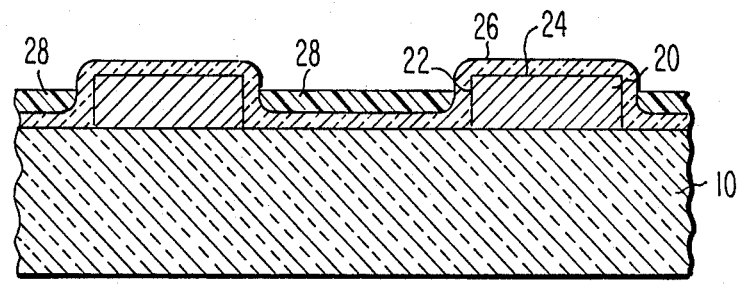
Figure 5:
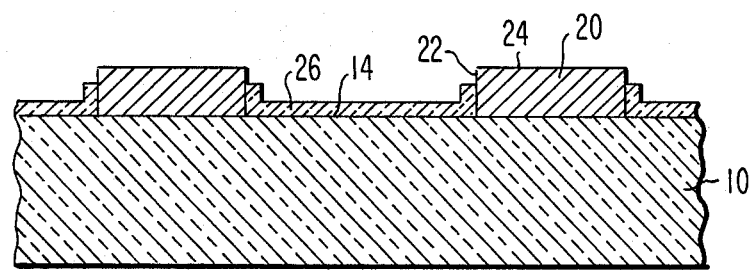

As shown in FIG. 4, the unexposed portion of the photoresist layer 28 is then removed with a suitable solvent. This exposes the portions of the silicon oxide layer 26 which are directly over the top surface 24 of each island 20 and a portion of the silicon oxide layer 26 which is along the side surfaces of the islands 20. The exposed portions of the silicon oxide layer 26 are then removed with a suitable etchant which does not excessively etch the silicon of the islands 20. A buffered hydrofluoric acid etch or a plasma etch under isotropic conditions can be used for this purpose. A slight overetching of the silicon oxide layer 26 may be desirable to ensure removal of the portion of the silicon oxide layer 26 at the corners of the islands 20 and along a portion of the side surfaces 22. If the remaining photoresist layer 28 is of a thickness to extend to the top surface 24 of the islands 20, an overetching of the silicon oxide layer 26 becomes necessary in order to remove the silicon oxide layer 26 from the corners of the islands 20 and the top portions of the side surfaces 22. As shown in FIG. 5, this exposes the top surfaces 24 of the islands 20 and portions of the side surfaces 22, leaving the silicon oxide layer 26 on the sapphire substrate 14 and along a portion of the side surfaces 22 of the islands 20. The remainder of the photoresist layer 28 is then removed with a suitable solvent.

Figure 6:
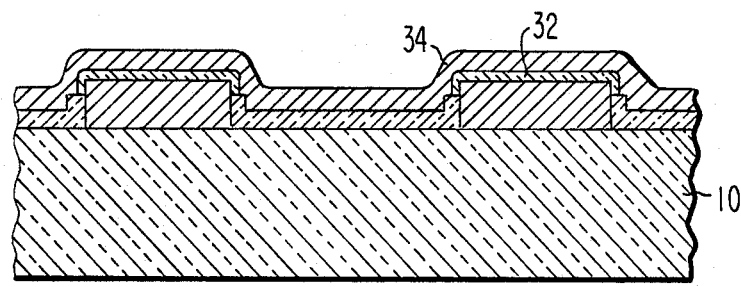

MOS field-effect transistors can then be formed in the islands 20 using any standard technique. For example, as shown in FIG. 6, a thin layer 32 of silicon oxide can be formed on the top surface 24 of the island and the portions of the side surfaces 22 not covered by the silicon oxide layer 26. The thin silicon oxide layer 32 can be formed by heating the islands 20 at a temperature of about 900° C. in an oxidizing atmosphere, such as water vapor. The thin silicon oxide layer 32 will form the channel dielectric of the MOS field-effect transistor. A layer 34 of polycrystalline silicon is then deposited over the silicon oxide layer 26 and the channel dielectric layer 32. The polycrystalline silicon layer 34 may be made conductive by doping it with phosphorus. Using standard photolithographic techniques, the polycrystalline silicon layer 34 is then defined in the form of strips extending across the portions of the islands 20 which are to be the channel regions of the MOS field-effect transistors. These strips of the polycrystalline silicon layer 34 will then serve as the gates of the field-effect transistors. The strips of polycrystalline silicon will extend over the silicon oxide layers 26 from one island 20 to another to provide the desired connection between the gates of the field-effect transistors. Using the gate forming strips of polycrystalline silicon as a mask, ions of an appropriate conductivity type material are then implanted into the islands 20 on each side of the gate strips to form the source and drains of the field-effect transistors. Additional strips of polycrystalline silicon may be formed on the device with the strips making ohmic contact with the source and drain regions formed in the islands 20 and extending over the silicon oxide layers 26 to electrically connect the various field-effect transistors in a desired circuit arrangement.

In the integrated circuit of the present invention, the polycrystalline silicon interconnects are not directly on the surface of the sapphire substrate 10 but are on a layer of silicon oxide which is between the polycrystalline silicon layer and the sapphire substrate. The silicon oxide has a higher band gap than sapphire and thereby forms a potential barrier to electron flow. Thus, the silicon oxide layer 26 will prevent, or at least minimize, the flow of radiation induced electrons from the sapphire substrate 10 to the polycrystalline silicon conductive lines and thereby prevent any adverse effect to the integrated circuit as a result of the radiation. By having the silicon oxide layer 26 extend partway along the sides of the islands 20, there is provided full protection against the flow of electrons from the sapphire substrate to the conductive polycrystalline silicon lines. However, the top surface and portions of the side surfaces of the islands are not covered by the silicon oxide layer 26 so that it does not adversely affect the characteristics of the field-effect transistor formed in the islands. Although there may be some electrons induced in the silicon oxide layer 26 by the radiation, the number of such electrons will be extremely small due to the limited volume of the silicon oxide layer. Thus, such electrons will not adversely affect the charactertistics of the circuit being formed.

We claim:

1. An integrated circuit comprising:
   a substrate of sapphire having a major surface;
   at least one island of single-crystalline silicon on said substrate surface;
   a first layer comprising an insulating material on said substrate surface and extending partially along the bottom portions of the side surfaces of said island, said insulating material being of a thickness less than the thickness of said island;
   a second layer comprising silicon oxide on the top surface of said island and on the upper portions of said side surfaces not covered by said layer of insulating material, said layer of silicon oxide having a thickness less than the thickness of said insulating material; and
   a layer of conductive polycrystalline silicon on said insulating layer and extending along the side surface of said island and over the top surface of the island contiguous with the top and sides of said second layer.

2. An integrated circuit in accordance with claim 1 wherein the insulating layer on the substrate surface is of a material having a higher band-gap than that of the sapphire substrate.

3. An integrated circuit in accordance with claim 2 wherein the insulating layer is of silicon oxide.

4. An integrated circuit in accordance with claim 3 in which the insulating layer is a conformal layer.

5. An integrated circuit in accordance with claim 1 in which there are at least two spaced apart islands of single-crystalline silicon on said surface of the substrate, the insulating layer is on the surface of the substrate between the islands and extends along a portion of a side surface of the islands, and the conductive polycrystalline silicon layer extends over the side surface and top surface of both islands as well as over the insulating layer between the islands.

6. An integrated circuit in accordance with claim 5 in which each island includes a field-effect transistor and the conductive polycrystalline silicon layer is a strip extending over the channel region of the transistors to form the gates of the transistors.

* * * * *